United States Patent
Nishioka

(10) Patent No.: US 9,653,641 B2
(45) Date of Patent: May 16, 2017

(54) LIGHT EMITTING DEVICE AND PROJECTOR

(71) Applicant: Seiko Epson Corporation, Tokyo (JP)

(72) Inventor: Hiroki Nishioka, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/757,410

(22) Filed: Dec. 23, 2015

(65) Prior Publication Data

US 2016/0190386 A1 Jun. 30, 2016

(30) Foreign Application Priority Data

Dec. 24, 2014 (JP) .................... 2014-260943

(51) Int. Cl.
| | |
|---|---|
| *H01L 33/00* | (2010.01) |
| *G03B 21/20* | (2006.01) |
| *G03B 21/00* | (2006.01) |
| *H01L 33/10* | (2010.01) |
| *H01L 33/14* | (2010.01) |
| *H01L 33/36* | (2010.01) |

(52) U.S. Cl.
CPC ........ *H01L 33/0045* (2013.01); *G03B 21/005* (2013.01); *G03B 21/2033* (2013.01); *H01L 33/10* (2013.01); *H01L 33/14* (2013.01); *H01L 33/36* (2013.01); *H01L 33/0012* (2013.01)

(58) Field of Classification Search
CPC ..... H01L 33/0045; H01L 33/10; H01L 33/14; H01L 33/36; H01L 33/0012; G03B 21/005; G03B 21/2033
See application file for complete search history.

(56) References Cited

U.S. PATENT DOCUMENTS

| | | | |
|---|---|---|---|
| 4,843,611 A | 6/1989 | Kwong et al. | |
| 2006/0215255 A1 | 9/2006 | Akiyama | |

(Continued)

FOREIGN PATENT DOCUMENTS

| | | |
|---|---|---|
| EP | 10-2008-014093 A1 | 7/2009 |
| JP | H06-237011 A | 8/1994 |

(Continued)

OTHER PUBLICATIONS

Extended European Search Report for Application No. EP 15 20 1988 dated Apr. 18, 2016 (7 pages).

(Continued)

*Primary Examiner* — Peter Bradford
(74) *Attorney, Agent, or Firm* — Harness, Dickey & Pierce, P.L.C.

(57) ABSTRACT

In a light emitting device, a light waveguide is provided with a first region including a central position, a second region including a first light emission surface, and a third region including a second light emission surface. A second cladding layer includes a plurality of noncontact regions. The plurality of noncontact regions intersect the light waveguide. A ratio of an area in which the plurality of noncontact regions overlap the first region to an area of the first region is greater than a ratio of an area in which the plurality of noncontact regions overlap the second region to an area of the second region, and is greater than a ratio of an area in which the plurality of noncontact regions overlap the third region to an area of the third region.

14 Claims, 15 Drawing Sheets

(56) References Cited

U.S. PATENT DOCUMENTS

| | | |
|---|---|---|
| 2006/0227818 A1 | 10/2006 | Gubenko et al. |
| 2010/0140632 A1 | 6/2010 | Doussiere |
| 2010/0284434 A1 | 11/2010 | Koenig et al. |
| 2011/0303892 A1 | 12/2011 | Mochizuki |
| 2011/0303924 A1 | 12/2011 | Mochizuki |
| 2014/0218701 A1 | 8/2014 | Nishioka |
| 2014/0240682 A1 | 8/2014 | Nishioka |
| 2016/0190385 A1* | 6/2016 | Nishioka ............. H01L 33/0045 353/85 |

FOREIGN PATENT DOCUMENTS

| | | |
|---|---|---|
| JP | 10-084130 | 3/1998 |
| JP | 2000-269600 A | 9/2000 |
| JP | 2000-349713 A | 12/2000 |
| JP | 2009-238847 A | 10/2009 |
| JP | 2014-150166 A | 8/2014 |

OTHER PUBLICATIONS

Patterson, B.D., et al., "Focused-Ion Beam Modification of Waveguide Photonic Devices", Microelectronic Engineering, Elsevier Publishers BV., Amsterdam, NL, vol. 27, No. 1-4, Feb. 2, 1995, pp. 347-350.

* cited by examiner

LIGHT EMITTING DEVICE AND PROJECTOR

BACKGROUND

1. Technical Field

The present invention relates to a light emitting device and a projector.

2. Related Art

A semiconductor light emitting device such as a semiconductor laser or a super luminescent diode (hereinafter, referred to as an "SLD") is used as, for example, a light source of a projector. The SLD is a semiconductor light emitting device which has an incoherent property in the same manner as a normal light emitting diode, exhibits a wide-band spectral shape, and can generate an output of several hundreds mW with a single element in the same manner as the semiconductor laser in terms of light output characteristics.

For example, JP-A-2009-238847 discloses an SLD having a waveguide which is tilted in a stripe shape.

Light is exponentially amplified toward a light emission surface which emits the light in a light waveguide of the above-described SLD. For this reason, there is a case where gain saturation may occur due to the number of carriers converted into light becoming insufficient in the vicinity of the light emission surface, and thus the output of the SLD may be reduced.

SUMMARY

An advantage of some aspects of the invention is to provide a light emitting device which can achieve high output by reducing gain saturation. Another advantage of some aspects of the invention is to provide a projector including the light emitting device.

A light emitting device according to an aspect of the invention includes an active layer that can generate light in accordance with a current injected thereinto; a first cladding layer and a second cladding layer that are disposed with the active layer interposed therebetween; and a first electrode and a second electrode that inject the current into the active layer, in which the active layer constitutes a light waveguide through which light is guided, in which the light waveguide is provided with a first light emission surface and a second light emission surface from which light is emitted; a first region including a central position (midpoint) that is equidistant from the first light emission surface and the second light emission surface; a second region including the first light emission surface; and a third region including the second light emission surface, and the second cladding layer includes a plurality of noncontact regions that are not in contact with the second electrode. Here, the plurality of noncontact regions intersect the light waveguide when viewed from a stacking direction of the active layer and the first cladding layer, and, when viewed from the stacking direction, a ratio of an area in which the plurality of noncontact regions overlap the first region to an area of the first region is greater than a ratio of an area in which the plurality of noncontact regions overlap the second region to an area of the second region, and is greater than a ratio of an area in which the plurality of noncontact regions overlap the third region to an area of the third region.

In the light emitting device, it is possible to reduce gain saturation and thus to achieve high output.

The light emitting device according to the aspect of the invention may further include a contact layer that is provided between the second cladding layer and the second electrode. Here, the contact layer may not be provided in the plurality of noncontact regions.

In the light emitting device with this configuration, it is possible to easily control a region of the light waveguide into which a current is injected.

In the light emitting device according to the aspect of the invention, the plurality of noncontact regions may only intersect the first region when viewed from the stacking direction.

In the light emitting device with this configuration, when viewed from the stacking direction, a ratio of an area in which the plurality of noncontact regions overlap the first region to an area of the first region can be made greater than a ratio of an area in which the plurality of noncontact regions overlap the second region to an area of the second region, and can be made greater than a ratio of an area in which the plurality of noncontact regions overlap the third region to an area of the third region.

In the light emitting device according to the aspect of the invention, pitches of the plurality of noncontact regions may be gradually increased toward the first light emission surface and the second light emission surface from the central position.

In the light emitting device with this configuration, it is possible to emit light with high efficiency.

In the light emitting device according to the aspect of the invention, when viewed from the stacking direction, pitches of the plurality of noncontact regions overlapping the first region may be the same as each other, pitches of the plurality of noncontact regions overlapping the second region may be gradually increased toward the first light emission surface from the central position, and pitches of the plurality of noncontact regions overlapping the third region may be gradually increased toward the second light emission surface from the central position.

In the light emitting device with this configuration, it is possible to emit light with high efficiency.

In the light emitting device according to the aspect of the invention, a length of the first region in an extending direction of the light waveguide may be L/4 or more and 3L/4 or less when a length of the light waveguide in the extending direction between the first light emission surface and the second light emission surface is set to L.

In the light emitting device with this configuration, it is possible to reduce gain saturation and thus to achieve high output.

In the light emitting device according to the aspect of the invention, the light waveguide may extend in a tilted direction with respect to a normal line of the first light emission surface and a normal line of the second light emission surface.

In the light emitting device with this configuration, a direct resonator is not formed, and thus it is possible to prevent laser oscillation of light generated in the light waveguide. As a result, it is possible to reduce speckle noise in the light emitting device.

A projector according to another aspect of the invention includes the light emitting device according to the aspect of the invention; a light modulation device that modulates light emitted from the light emitting device according to image information; and a projection device that projects an image formed by the light modulation device.

The projector includes the light emitting device according to the aspect of the invention and can thus achieve high luminance.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The embodiments described below are not intended to improperly limit the scope of the invention disclosed in the appended claims. It cannot be said that all constituent elements described below are essential constituent elements of the invention.

1. First Embodiment

1.1. Light Emitting Device

Figure 1:
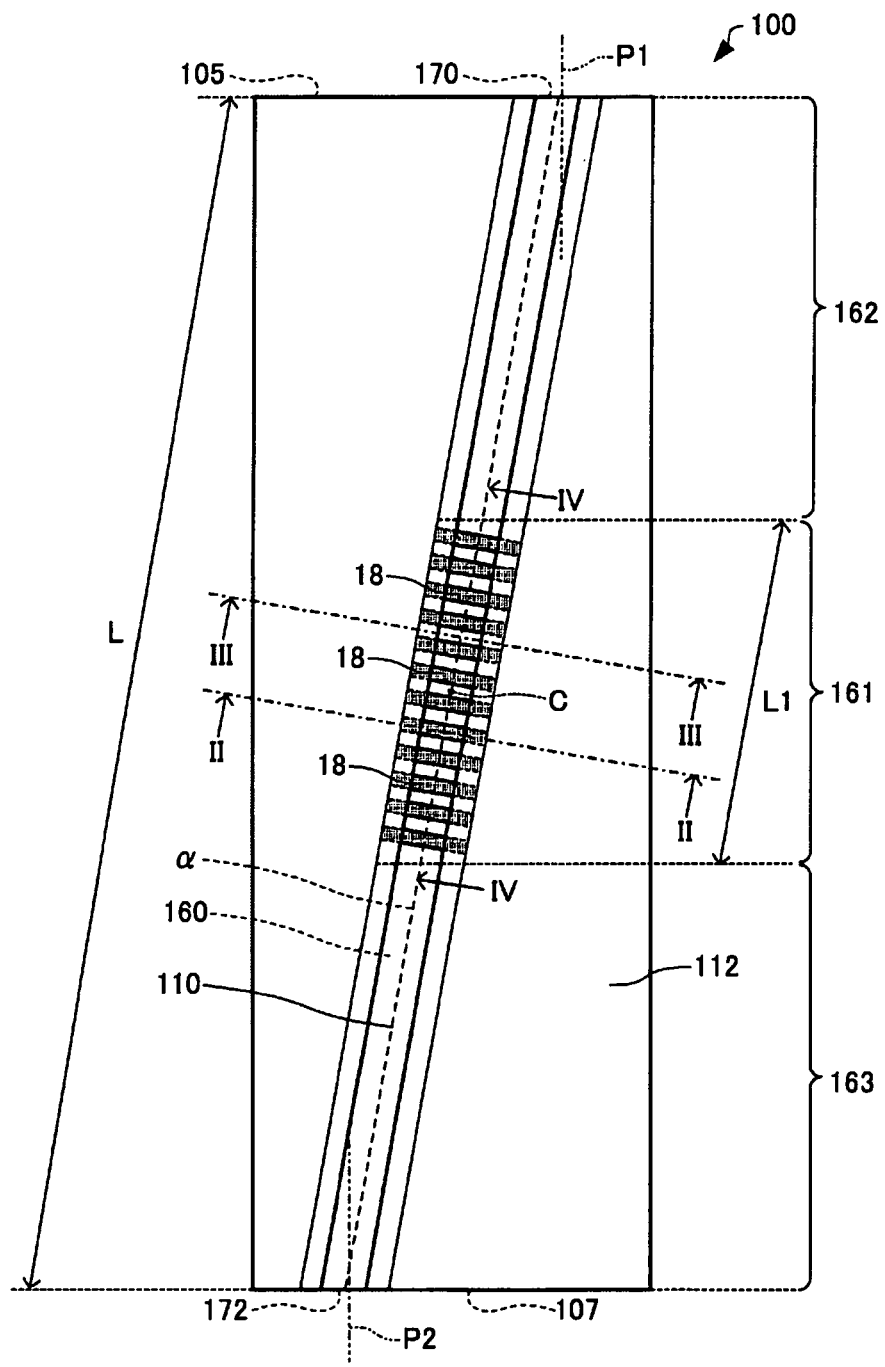
FIG. 1 is a plan view schematically illustrating a light emitting device according to a first embodiment.
Figure 2:
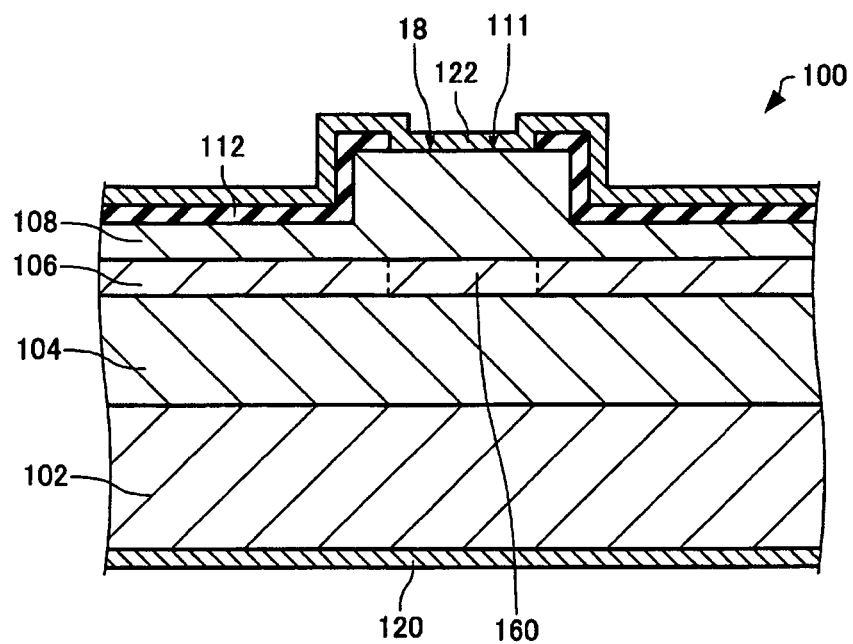
FIG. 2 is a sectional view schematically illustrating the light emitting device according to the first embodiment.
Figure 3:
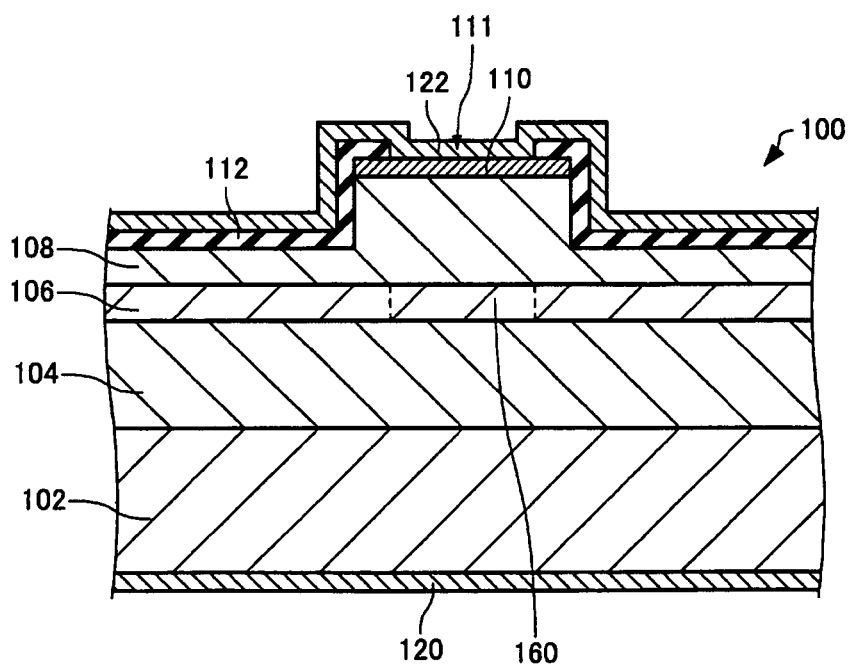
FIG. 3 is a sectional view schematically illustrating the light emitting device according to the first embodiment.
Figure 4:
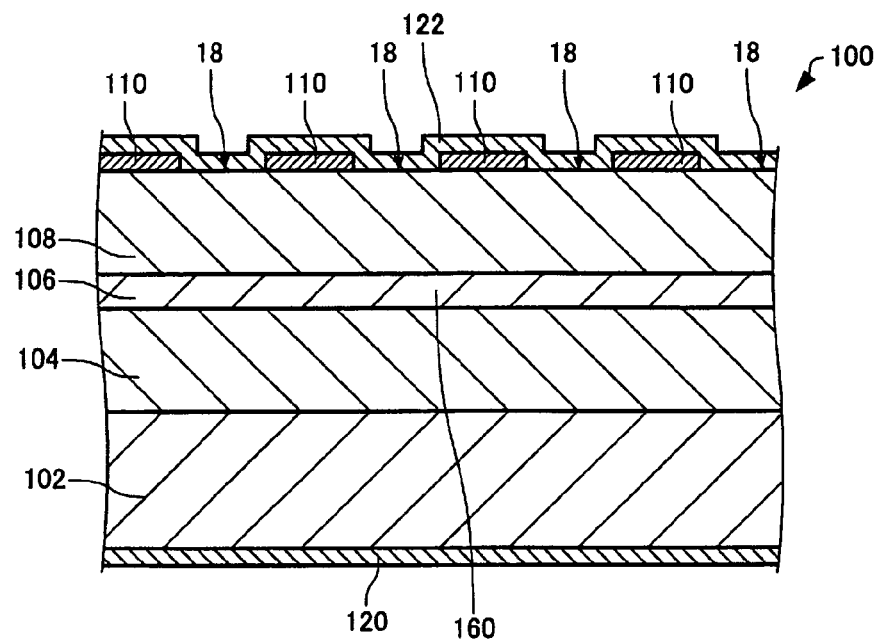
FIG. 4 is a sectional view schematically illustrating the light emitting device according to the first embodiment.

First, a description will be made of alight emitting device according to a first embodiment with reference to the drawings. FIG. 1 is a plan view schematically illustrating alight emitting device 100 according to the first embodiment. FIG. 2 is a sectional view taken along the line II-II of FIG. 1 and schematically illustrates the light emitting device 100 according to the first embodiment. FIG. 3 is a sectional view taken along the line III-III of FIG. 1 and schematically illustrates the light emitting device 100 according to the first embodiment. FIG. 4 is a sectional view taken along the line IV-IV of FIG. 1 and schematically illustrates the light emitting device 100 according to the first embodiment.

The light emitting device 100 includes, as illustrated in FIGS. 1 to 4, a substrate 102, a first cladding layer 104, an active layer 106, a second cladding layer 108, a contact layer 110, an insulating layer 112, a first electrode 120, and a second electrode 122. For convenience, FIG. 1 does not illustrate the second electrode 122.

The substrate 102 is, for example, a first conductivity type (for example, an n-type) GaAs substrate.

The first cladding layer 104 is provided on the substrate 102. The first cladding layer 104 is, for example, an n-type InGaAlP layer. Although not illustrated, a buffer layer may be formed between the substrate 102 and the first cladding layer 104. The buffer layer is, for example, an n-type GaAs layer, AlGaAs layer, or InGaP layer. The buffer layer can improve crystal quality of a layer formed thereon.

The active layer 106 is provided on the first cladding layer 104. The active layer 106 has, for example, a multiple quantum well (MQW) structure in which three quantum well structures each having an InGaP well layer and an InGaAlP barrier layer overlap each other.

As illustrated in FIG. 1, the active layer 106 has a first side surface 105 and a second side surface 107. The side surfaces 105 and 107 are surfaces (parallel surfaces in the illustrated example) which face in directions opposite to each other. The side surfaces 105 and 107 are surfaces which do not come into planar contact with the cladding layers 104 and 108. The side surfaces 105 and 107 may be cleavage surfaces which are formed through cleavage.

The active layer 106 is a layer into which a current is injected and which can generate light. The active layer 106 constitutes a light waveguide 160 through which light is guided. Light guided through the light waveguide 160 may receive a gain in the light waveguide 160.

The light waveguide 160 extends from the first side surface 105 to the second side surface 107 when viewed from the stacking direction of the active layer 106 and the first cladding layer 104 (hereinafter, referred to as "in a plan view"). The light waveguide 160 has a first light emission surface 170 and a second light emission surface 172 which allow light to be emitted. The first light emission surface 170 is a connection portion with the first side surface 105 of the light waveguide 160. The second light emission surface 172 is a connection portion with the second side surface 107 of the light waveguide 160. The light waveguide 160 extends in a tilted direction with respect to a normal line P1 of the first light emission surface 170 and a normal line P2 of the second light emission surface 172. In the illustrated example, a vertical straight line (a central line a) which passes through a center of the first light emission surface 170 and the center of the second light emission surface 172 extends in a tilted direction with respect to the normal lines P1 and P2.

The light waveguide 160 has a predetermined width and has a strip and linear rectangular shape in the extending direction of the light waveguide, for example, in a plan view. The extending direction of the light waveguide 160 is the extending direction of the central line a, for example, in a plan view.

The light waveguide 160 includes a first region 161, a second region 162, and a third region 163. The first region 161 is a region including a central position C equidistant from the first light emission surface 170 and the second light emission surface 172. In the example illustrated in FIG. 1, the central position C is a point on the central line a whose distances to the light emission surfaces 170 and 172 are the same as each other.

The second region 162 includes the first light emission surface 170. The third region 163 includes the second light emission surface 172. In the illustrated example, the second region 162 extends from the first light emission surface 170 to one end of the first region 161. The third region 163 extends from the second light emission surface 172 to the other end of the first region 161. In the illustrated example, a planar shape (a shape when viewed from the stacking direction of the active layer 106 and the first cladding layer 104) of each of the regions 161, 162 and 163 is a parallelogramatic shape. Although not illustrated, the regions 161, 162 and 163 may be separated from each other.

A length L1 of the first region 161 in the extending direction of the light waveguide 160 is L/4 or more and 3L/4 or less when a length of the light waveguide 160 between the first light emission surface 170 and the second light emission surface 172 is set to L. The length L1 of the first region 161, a length of the second region 162 in the extending direction of light waveguide 160, and a length of the third region 163 in the extending direction of the light waveguide 160 may be the same as each other and may be L/3.

The second cladding layer 108 is provided on the active layer 106. The second cladding layer 108 is, for example, a second conductivity type (for example, a p-type) InGaAlP layer. Each of the cladding layers 104 and 108 has a band gap larger than that of the active layer 106 and a refractive index smaller than that thereof. The cladding layers 104 and 108 are provided with the active layer 106 interposed therebetween and have a function of minimizing leakage of injected carriers (electrons and holes) and light.

The second cladding layer 108 includes a plurality of noncontact regions 18 which are not electrically connected to the second electrode 122. The noncontact regions 18 are not in contact with the contact layer 110 in a plan view. In the illustrated example, the noncontact regions 18 are not in contact with the contact layer 110 in a pillar shaped portion 111 which will be described later. The noncontact regions 18 are in contact with, for example, the second electrode 122 and the insulating layer 112. The number of noncontact regions 18 is not particularly limited as long as a plurality of noncontact regions 18 are provided.

The plurality of noncontact regions 18 intersect the light waveguide 160 in a plan view. In other words, the noncontact regions 18 have portions which overlap the light waveguide 160 and portions which do not overlap the light waveguide 160 in a plan view. In the illustrated example, a planar shape of each of the noncontact regions 18 is a rectangular shape, and the light waveguide 160 intersects the long sides of the noncontact regions 18.

A length of each of the noncontact regions 18 in the extending direction of the light waveguide 160 is preferably 20 μm or less, and is more preferably 10 μm or less. Consequently, it is possible to reduce light loss in the portion (noncontact region overlapping portion) of the light waveguide 160 overlapping the noncontact regions 18 in a plan view. Specifically, a current which does not cause light loss can be diffused from the portion of the light waveguide 160 overlapping the contact layer 110 to the noncontact region overlapping portion.

In a plan view, a ratio (B1/A1) of an area B1 in which the plurality of noncontact regions 18 overlap the first region 161 to an area A1 of the first region 161 is greater than a ratio (B2/A2) of an area B2 in which the plurality of noncontact regions 18 overlap the second region 162 to an area A2 of the second region 162. The ratio (B1/A1) is greater than a ratio (B3/A3) of an area B3 in which the plurality of noncontact regions 18 overlap the third region 163 to an area A3 of the third region 163. In the illustrated example, the plurality of noncontact regions 18 only overlap the light waveguide 160 in the first region 161 in a plan view.

Pitches of the noncontact regions 18 overlapping the first region 161 are the same as each other. In other words, shapes and sizes of the plurality of noncontact regions 18 are the same as each other, and intervals between the respective noncontact regions 18 which are adjacent to each other are the same as each other. The pitch of the noncontact regions 18 is a distance between the centers of the noncontact regions 18 which are adjacent to each other, for example, in a plan view. In FIG. 1, the shapes, the sizes, and the pitches of the plurality of noncontact regions 18 are the same each other, but the shapes, the sizes, and the pitches thereof are not necessarily the same as each other.

The noncontact regions 18 are disposed so as to be symmetric to each other with respect to, for example, the central position C. Consequently, the intensity of light emitted from the first light emission surface 170 can be made the same as the intensity of light emitted from the second light emission surface 172.

In the light emitting device 100, a pin diode is constituted by the p-type second cladding layer 108, the active layer 106 with which impurities are not doped, and the n-type first cladding layer 104. In the light emitting device 100, if a forward bias voltage of the pin diode is applied (a current is injected) between the electrodes 120 and 122, the light waveguide 160 is generated in the active layer 106, and recombination between electrons and holes occurs in the light waveguide 160. This recombination causes light to be emitted. Chain inductive emission occurs due to the generated light, and thus the intensity of the light is amplified in the light waveguide 160. The light waveguide 160 is constituted of the active layer 106 through which the light is guided, and the cladding layers 104 and 108 which minimize leakage of the light.

The contact layer 110 is provided on the second cladding layer 108. The contact layer 110 is provided between the second cladding layer 108 and the second electrode 122. The contact layer 110 is not provided on the noncontact regions 18 of the second cladding layer 108. The contact layer 110 is, for example, a p-type GaAs layer. The contact layer 110 is in ohmic contact with the second electrode 122. The contact layer 110 is more conductive than the cladding layers 104 and 108.

Parts of the contact layer 110 and the second cladding layer 108 constitute the pillar shape portion (a so-called ridge portion) 111. The light emitting device 100 is a refractive index waveguide type SLD. A planar shape of the light waveguide 160 may be the same as a shape of a contact surface between the pillar shape portion 111 and the second electrode 122. A planar shape of the light waveguide 160 may be a shape (a shape which becomes wider as a current from the contact portion between the contact layer 110 and the second electrode 122 is diffused) which is wider in a direction perpendicular to the extending direction of the light waveguide 160 than the shape of the contact surface between the pillar shape portion 111 and the second electrode 122. Although not illustrated, a side surface of the pillar shape portion 111 may be tilted.

The insulating layer 112 is provided on the second cladding layer 108, the lateral sides of the pillar shape portion 111 (the periphery of the pillar shape portion 111 in a plan view), and a part of the top of the pillar shape portion 111. The insulating layer 112 is, for example, a SiN layer, a $SiO_2$ layer, a SiON layer, an $Al_2O_3$ layer, or a polyimide layer. In a case where the above-described material is used as the insulating layer 112, a current between the electrodes 120 and 122 avoids the insulating layer 112 and flows through the pillar shape portion 111 located between the insulating layers 112.

The insulating layer 112 has a refractive index lower than a refractive index of the second cladding layer 108. An effective refractive index of a vertical section of the portion forming the insulating layer 112 is lower than an effective refractive index of a vertical section of the portion not forming the insulating layer 112, that is, the portion forming the pillar shape portion 111. Although not illustrated, the insulating layer 112 may not be provided. In this case, air surrounding the pillar shape portion 111 functions in the same manner as the insulating layer 112.

The first electrode 120 is provided under the substrate 102. The first electrode 120 is provided on a lower surface of a layer (the substrate 102 in the illustrated example) which is in ohmic contact with the first electrode 120. The first electrode 120 is one electrode for driving (for injecting a current into the active layer 106) the light emitting device 100. As the first electrode 120, for example, an electrode is used in which a Cr layer, a AuGe layer, a Ni layer, and a Au layer are stacked in this order from the first cladding layer 104 side.

The second electrode 122 is provided on the pillar shape portion 111 and the insulating layer 112. The second electrode 122 is provided to include the positions of the first light emission surface 170 and the second light emission surface 172 in a plan view. The second electrode 122 is the other electrode (for injecting a current into the active layer 106) the light emitting device 100. As the second electrode 122, for example, an electrode is used in which a Cr layer, a AuZn layer, and a Au layer are stacked in this order from the pillar shape portion 111 side. The second electrode 122 may be provided to not include the positions of the first light emission surface 170 and the second light emission surface 172 in a plan view. For example, an end of the second electrode 122 may be provided on the light waveguide 160 further inward than the position of the first light emission surface 170 or the second light emission surface 172 in a plan view.

Although not illustrated, antireflection (AR) films may be provided on the side surfaces 105 and 107. Consequently, light can be efficiently emitted from the light emission surfaces 170 and 172. The antireflection films may be formed of, for example, a $SiO_2$ layer, a $Ta_2O_5$ layer, an $Al_2O_3$ layer, a TiN layer, a $TiO_2$ layer, a SiON layer, or a SiN layer, or multiple layers thereof.

In the above description, the AlGaInP-based light emitting device 100 has been described, but all materials may be used which can form a light emitting device and a light waveguide according to an embodiment of the invention. Regarding semiconductor materials, for example, AlGaN-based, GaN-based, InGaN-based, GaAs-based, AlGaAs-based, InGaAs-based, InGaAsP-based, InP-based, GaP-based, AlGaP-based, and ZnCdSe-based semiconductor materials may be used.

The light emitting device 100 is applicable to light sources of, for example, a projector, a display, a lighting apparatus, and a measurement apparatus.

The light emitting device 100 has the following features, for example.

In the light emitting device 100, the second cladding layer 108 includes the plurality of noncontact regions 18 which are not electrically connected to the second electrode 122; the plurality of noncontact regions 18 intersect the light waveguide 160 in a plan view; the ratio (B1/A1) of the area B1 in which the plurality of noncontact regions 18 overlap the first region 161 to the area A1 of the first region 161 is greater than the ratio (B2/A2) of the area B2 in which the plurality of noncontact regions 18 overlap the second region 162 to the area A2 of the second region 162; and the ratio (B1/A1) is greater than the ratio (B3/A3) of the area B3 in which the plurality of noncontact regions 18 overlap the third region 163 to the area A3 of the third region 163. Therefore, in the light emitting device 100, the noncontact regions 18 are not in ohmic contact with the second electrode 122 and thus have high resistance, and an amount of current injected into the active layer 106 overlapping the noncontact regions 18 in a plan view is small. For this reason, in the light emitting device 100, the ratio (B1/A1) is made greater than the ratio (B2/A2) and the ratio (B3/A3), and thus it is possible to reduce gain saturation and thus to achieve high output. Hereinafter, the reason thereof will be described.

Figure 5A:
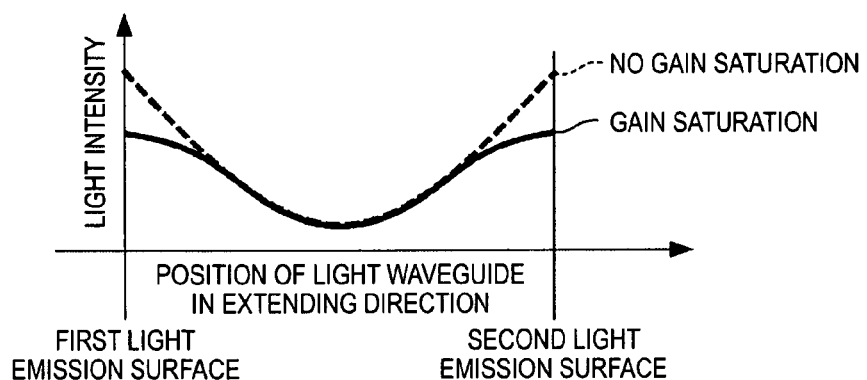
FIGS. 5A and 5B are diagrams for explaining a relationship between a position of a light waveguide in an extending direction, light intensity, and an averaged current amount.
Figure 5B:
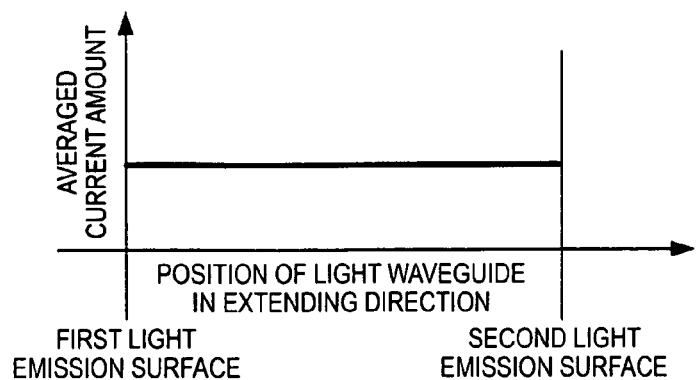
Figure 6A:
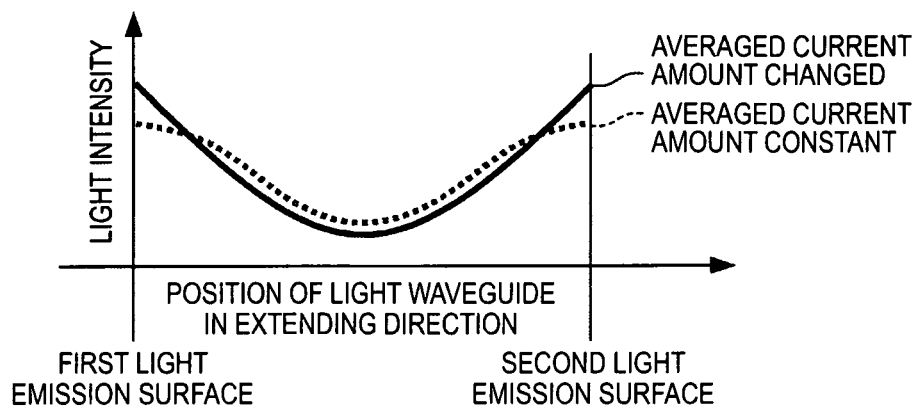
FIGS. 6A and 6B are diagrams for explaining a relationship between a position of the light waveguide in the extending direction, light intensity, and an averaged current amount.
Figure 6B:
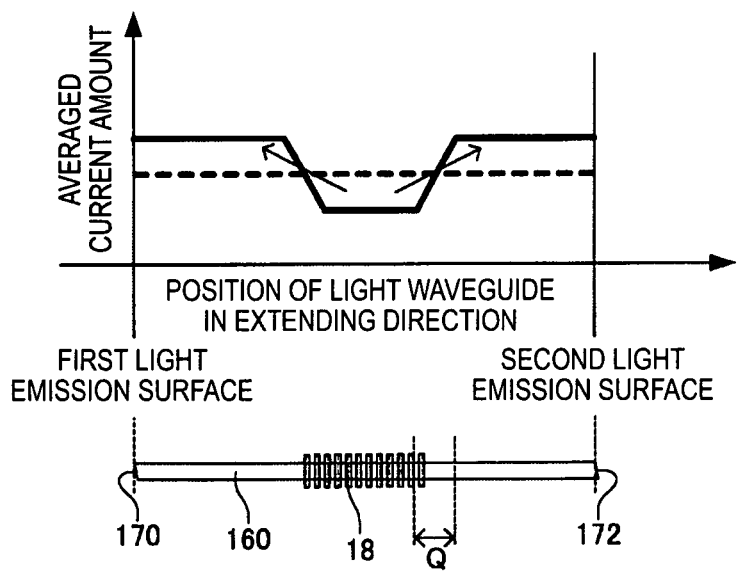

FIGS. 5A and 6A are diagrams for explaining a relationship between a position of the light waveguide in the extending direction (propagation direction) and light intensity. FIGS. 5B and 6B are diagrams for explaining a relationship between a position of the light waveguide in the extending direction and an averaged current amount.

The position of the light waveguide in the extending direction expressed by the transverse axes of FIGS. 5A to 6B indicates a position of the light waveguide in the extending direction between the first light emission surface and the second light emission surface.

Figure 7:
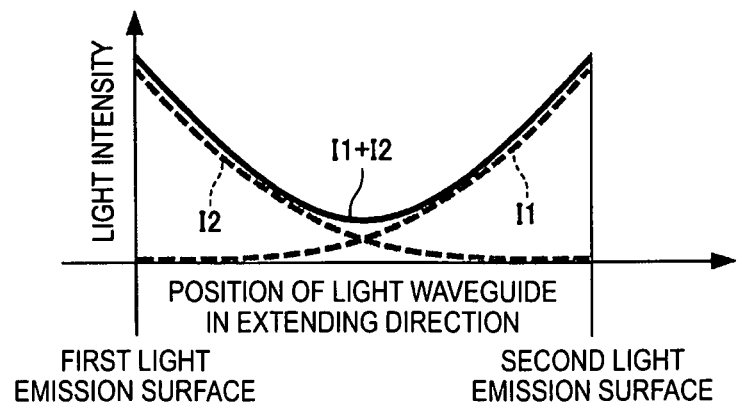
FIG. 7 is a diagram for explaining a relationship between a position of the light waveguide in the extending direction and light intensity.

The light intensity expressed by the longitudinal axes of FIGS. 5A and 6A indicates the number of photons which pass through a section perpendicular to the extending direction of the light waveguide per time unit at a position of the light waveguide in the extending direction. The light intensity of FIGS. 5A and 6A is a sum of light intensity I1 of light which is directed from the first light emission surface toward the second light emission surface and light intensity I2 of light which is directed from the second light emission surface toward the first light emission surface, as illustrated in FIG. 7.

The averaged current amount expressed by the longitudinal axes of FIGS. 5B and 6B is an amount of current which is averaged with a predetermined length Q in the extending direction of the light waveguide centering on a certain position at a position of the light waveguide in the extending direction. In other words, the averaged current amount corresponds to a ratio of an area in which the contact layer overlaps the light waveguide to an area of the light waveguide in a plan view in a case where the light waveguide is cut by the predetermined length Q centering on a certain position. The predetermined length Q is several times the length of the light waveguide in the noncontact region in the extending direction and about 1/10 or less of the length of the entire light waveguide in the extending direction.

In the SLD, light is exponentially amplified toward a light emission surface (a surface having a lower reflectance). For this reason, as illustrated in FIGS. 5A and 5B, the light intensity has a nonuniform distribution in the extending direction of the light waveguide. Thus, in a case where the averaged current amount is constant in the extending direction of the light waveguide, carriers become insufficient relative to light (relative to photons) in the vicinity of the light emission surface. In other words, when the light is about to be amplified, carriers converted into the light become insufficient. As a result, gain saturation occurs in the vicinity of the light emission surface with great light intensity, and, accordingly, light output is reduced.

A portion (for example, the first region 161) with small light intensity is in a state in which there are more carriers than in the vicinity of the light emission surface, and the carriers are not sufficiently converted into light and thus remain therein. As illustrated in FIGS. 6A and 6B, such remaining carriers are injected into the vicinity of the light emission surface in which carriers are insufficient, and thus it is possible to perform driving with high efficiency while achieving high output. In other words, it is possible to reduce the gain saturation and thus to increase final light output while maintaining the magnitude of a current injected into the entire light waveguide to be constant by changing the averaged current amount.

In the light emitting device 100, as described above, the ratio (B1/A1) is made greater than the ratio (B2/A2) and the ratio (B3/A3), and thus it is possible to make an averaged current amount in the second region 162 and an averaged current amount in the third region 163 larger than an averaged current amount in the first region 161. For this reason, in the light emitting device 100, it is possible to prevent light output from being reduced due to the gain saturation without increasing an amount of current injected into the entire light waveguide 160. In other words, in the light emitting device 100, it is possible to reduce the gain saturation and thus to achieve high output.

In the light emitting device 100, since an electrode for injecting a current into the respective regions 161, 162 and 163 of the light waveguide is a common electrode (since the electrode is not provided separately for each region), the light emitting device 100 can be easily driven.

In the light emitting device 100, since the plurality of noncontact regions 18 intersect the light waveguide 160 in a plan view, for example, even if positions of the noncontact regions 18 are deviated relative to desired positions when the light emitting device 100 is manufactured, noncontact regions 18 can overlap the light waveguide 160. Consequently, the ratio (B1/A1) can more reliably be made greater than the ratio (B2/A2) and the ratio (B3/A3).

In the light emitting device 100, the contact layer 110 is provided between the second cladding layer 108 and the second electrode 122, and the contact layer 110 is not provided in the plurality of noncontact regions 18. For this reason, in the light emitting device 100, an averaged current amount in the second region 162 and an averaged current amount in the third region 163 can be more reliably made larger than an averaged current amount in the first region 161. Here, since the contact layer is highly conductive, a current injected from a portion which is in contact with the second electrode of the contact layer is diffused in the contact layer. For this reason, for example, if a noncontact region is formed by providing an insulating portion between the contact layer and the second electrode without removing the contact layer, there is a case where it may be hard to inject a current into a desired region of the light waveguide. In the light emitting device 100, such a problem can be solved, and thus it is possible to easily control a region of the light waveguide 160 into which a current is injected.

In the light emitting device 100, the plurality of noncontact regions 18 only intersect the first region 161 in a plan view. For this reason, in the light emitting device 100, the ratio (B1/A1) can be made greater than the ratio (B2/A2) and the ratio (B3/A3).

In the light emitting device 100, the length L1 of the first region 161 in the extending direction of the light waveguide 160 is L/4 or more and 3L/4 or less when the length of the light waveguide 160 between the first light emission surface 170 and the second light emission surface 172 is set to L. Assuming that an averaged current amount is constant in the extending direction of the light waveguide 160, the length L1 may be a distance between a first position where carriers converted into light are neither insufficient nor remain when the light is about to be amplified on the first light emission surface 170 side and a second position where carriers converted into light are neither insufficient nor remain when the light is about to be amplified on the second light emission surface 172. Consequently, the light emitting device 100 can emit light with high efficiency.

In the light emitting device 100, the light waveguide 160 extends in the tilted direction with respect to the normal line P1 of the first light emission surface 170 and the normal line P2 of the second light emission surface 172. For this reason, in the light emitting device 100, it is possible to prevent light generated in the light waveguide 160 from being directly reflected in a multiple manner between the light emission surfaces 170 and 172. Consequently, in the light emitting device 100, a direct resonator is not formed, and thus it is possible to prevent laser oscillation of light generated in the light waveguide 160. As a result, it is possible to reduce speckle noise in the light emitting device 100.

In the light emitting device 100, the noncontact regions 18 are in physical contact with the second electrode 122. For this reason, in the light emitting device 100, it is possible to improve heat dissipation of the light waveguide 160 more than, for example, in a case where an insulating layer is provided between the noncontact regions 18 and the second electrode 122 (for example, refer to FIG. 13 to be described later). In the light emitting device 100, the second electrode 122 can be formed, for example, at a location which is highly flat, and thus it is possible to reduce a possibility of disconnection of the second electrode 122 more than, for example, in a case where an insulating layer is provided between the noncontact regions 18 and the second electrode 122.

1.2. Manufacturing Method of Light Emitting Device

Figure 8:
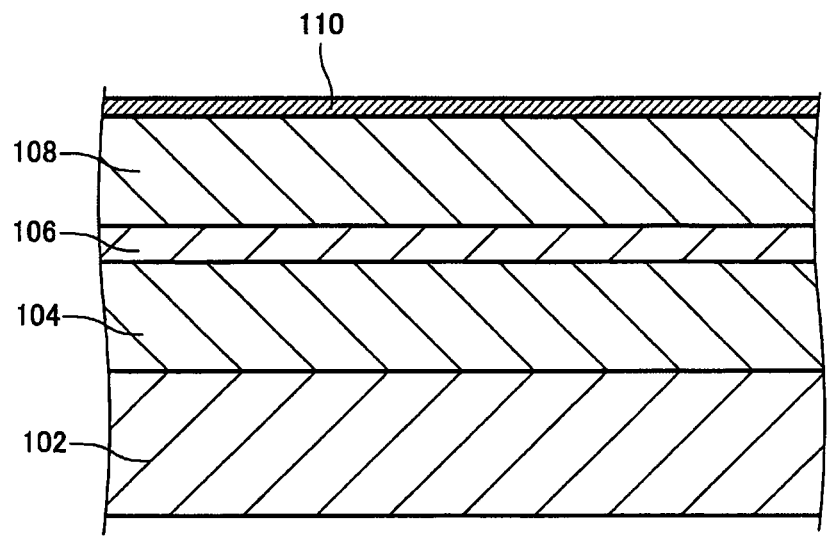
FIG. 8 is a sectional view schematically illustrating a manufacturing step of the light emitting device according to the first embodiment.
Figure 9:
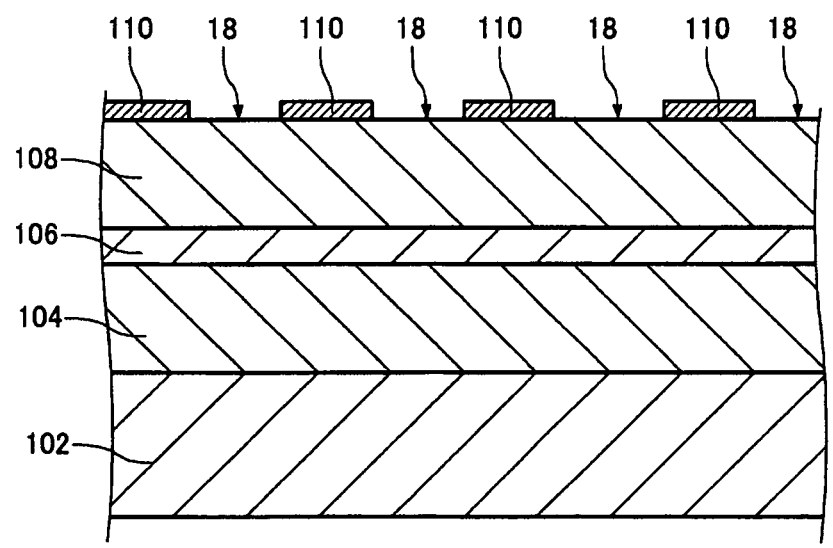
FIG. 9 is a sectional view schematically illustrating a manufacturing step of the light emitting device according to the first embodiment.

Next, a description will be made of a manufacturing method of the light emitting device 100 according to the present embodiment with reference to the drawings. FIGS. 8 and 9 are sectional views schematically illustrating manufacturing steps of the light emitting device 100 according to the present embodiment and correspond to FIG. 4.

As illustrated in FIG. 8, the first cladding layer 104, the active layer 106, the second cladding layer 108, and the contact layer 110 are subject to epitaxial growth on the substrate 102 in this order. As methods for the epitaxial growth, there may be, for example, a metal organic chemical vapor deposition (MOCVD) method, and a molecular beam epitaxy (MBE) method.

As illustrated in FIG. 9, the noncontact regions 18 are formed by patterning the contact layer 110. The patterning is performed through, for example, photolithography and etching.

As illustrated in FIGS. 2 and 3, the pillar shape portion 111 is formed by patterning the contact layer 110 and the second cladding layer 108. The patterning is performed through, for example, photolithography and etching. An order of forming the noncontact regions 18 and the pillar shape portion 111 are not particularly limited.

Next, the insulating layer 112 is formed to cover the side surfaces of the pillar shape portion 111. Specifically, the insulating layer 112 is formed by forming an insulating member (not illustrated) according to a chemical vapor deposition (CVD) method (more specifically, a plasma CVD method) or a coating method and by patterning the insulating member. The patterning is performed through, for example, photolithography and etching.

As illustrated in FIGS. 2 to 4, the second electrode 122 is formed on the pillar shape portion 111. Next, the first electrode 120 is formed on the lower surface of the substrate 102. The electrodes 120 and 122 are formed according to, for example, a vapor deposition method or a sputtering method. An order of forming the electrodes 120 and 122 is not particularly limited.

The light emitting device 100 can be manufactured through the above-described steps.

1.3. Modification Examples of Light Emitting Device

1.3.1. Modification Example 1

Figure 10:
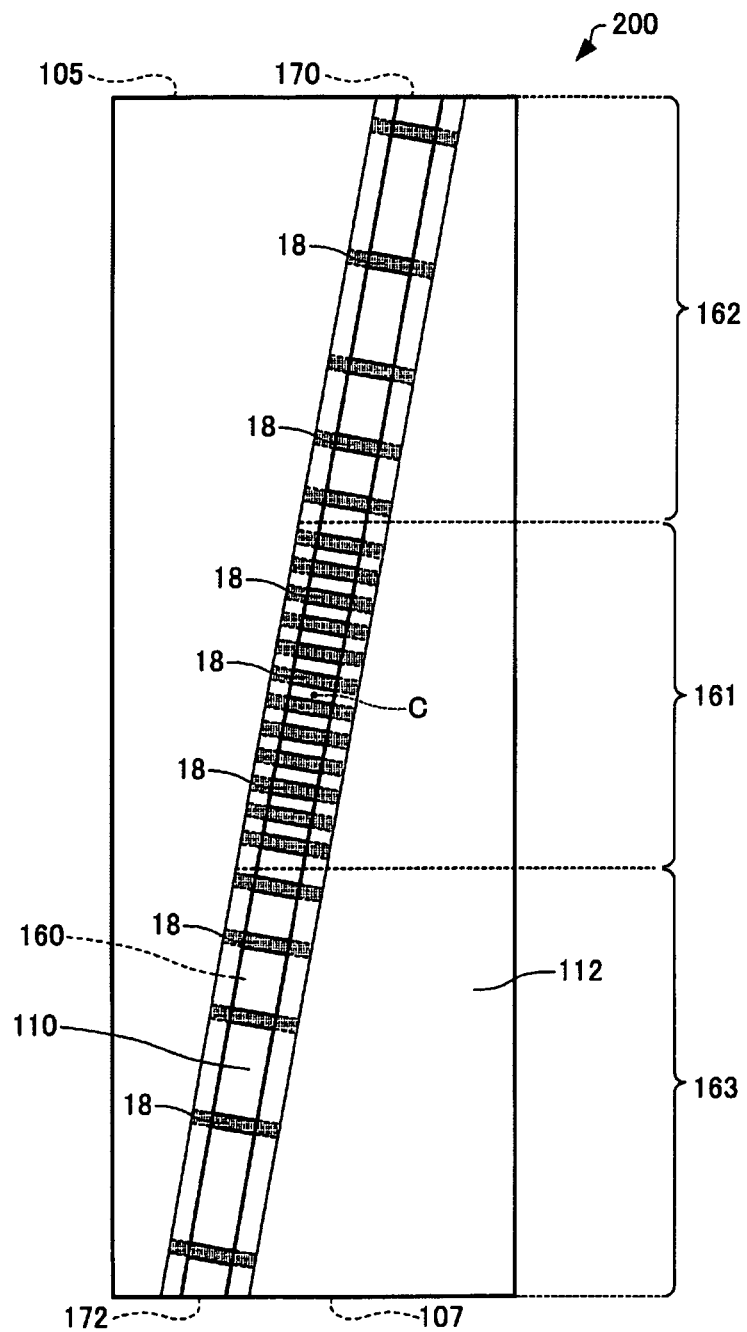
FIG. 10 is a plan view schematically illustrating a light emitting device according to Modification Example 1 of the first embodiment.

Next, a description will be made of a light emitting device according to Modification Example 1 of the first embodiment with reference to the drawings. FIG. 10 is a plan view schematically illustrating a light emitting device 200 according to Modification Example 1 of the first embodiment. For convenience, FIG. 10 does not illustrate the second electrode 122.

Hereinafter, in the light emitting device 200 according to Modification Example 1 of the first embodiment, differences from the example of the light emitting device 100 according to the first embodiment will be described, and similarities thereto will not be described. This is also the same for light emitting devices according to Modification Examples 2, 3, 4, 5, 6 and 7 to be described later of the first embodiment.

In the above-described light emitting device 100, as illustrated in FIG. 1, the noncontact regions 18 only intersect the light waveguide 160 in the first region 161 in a plan view. In contrast, in the light emitting device 200, as illustrated in FIG. 10, the noncontact regions 18 also intersect the light waveguide 160 in the second region 162 and the light waveguide 160 in the third region 163 in a plan view.

Figure 11:
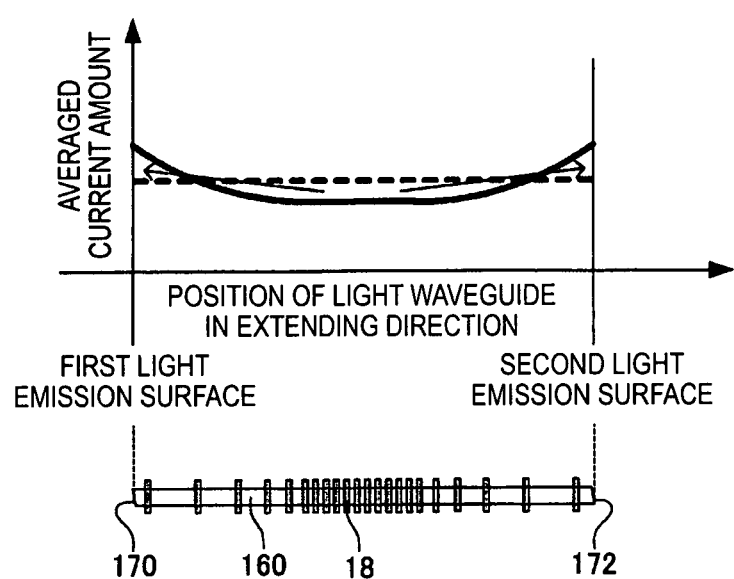
FIG. 11 is a diagram for explaining a relationship between a position of a light waveguide in an extending direction and an averaged current amount.

In the light emitting device 200, the pitches of the plurality of noncontact regions 18 overlapping the second region 162 are gradually increased toward the first light emission surface 170 from the central position C in a plan view. The pitches of the plurality of noncontact regions 18 overlapping the third region 163 are gradually increased toward the second light emission surface 172 from the central position C in a plan view. For this reason, in the light emitting device 200, as illustrated in FIG. 11, an averaged current amount can be gradually increased toward the first light emission surface 170 from the first region 161 side in the second region 162. In the light emitting device 200, an averaged current amount can be gradually increased toward the second light emission surface 172 from the first region 161 side in the third region 163.

In the light emitting device 200, the noncontact regions 18 can be disposed so that carriers converted into light are neither insufficient nor remain, for example, when the light is about to be amplified at respective positions of the regions 162 and 163 in the extending direction. For this reason, in the light emitting device 200, it is possible to emit light with high efficiency.

1.3.2. Modification Example 2

Figure 12:
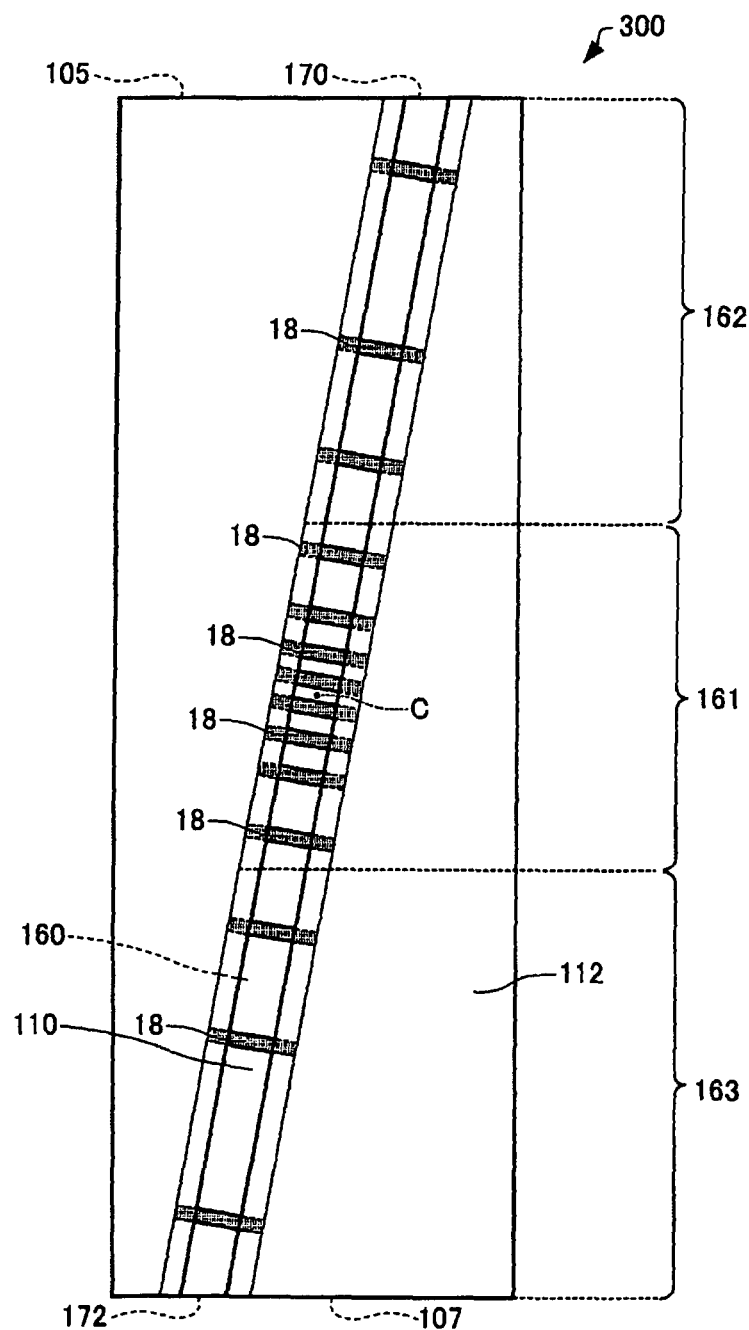
FIG. 12 is a plan view schematically illustrating a light emitting device according to Modification Example 2 of the first embodiment.

Next, a description will be made of a light emitting device according to Modification Example 2 of the first embodiment with reference to the drawings. FIG. 12 is a plan view schematically illustrating a light emitting device 300 according to Modification Example 2 of the first embodiment. For convenience, FIG. 12 does not illustrate the second electrode 122.

In the above-described light emitting device 100, as illustrated in FIG. 1, the noncontact regions 18 only intersect the light waveguide 160 in the first region 161 in a plan view. In contrast, in the light emitting device 300, as illustrated in FIG. 12, the noncontact regions 18 also intersect the light waveguide 160 in the second region 162 and the light waveguide 160 in the third region 163 in a plan view.

In the light emitting device 300, the pitches of the plurality of noncontact regions 18 are gradually increased toward the first light emission surface 170 from the central position C in a plan view. The pitches of the plurality of noncontact regions 18 are gradually increased toward the second light emission surface 172 from the central position C.

In the light emitting device 300, the noncontact regions 18 can be disposed so that carriers converted into light are neither insufficient nor remain, for example, when the light is about to be amplified at respective positions of the light waveguide 160 in the extending direction. For this reason, in the light emitting device 300, it is possible to emit light with high efficiency.

1.3.3. Modification Example 3

Figure 13:
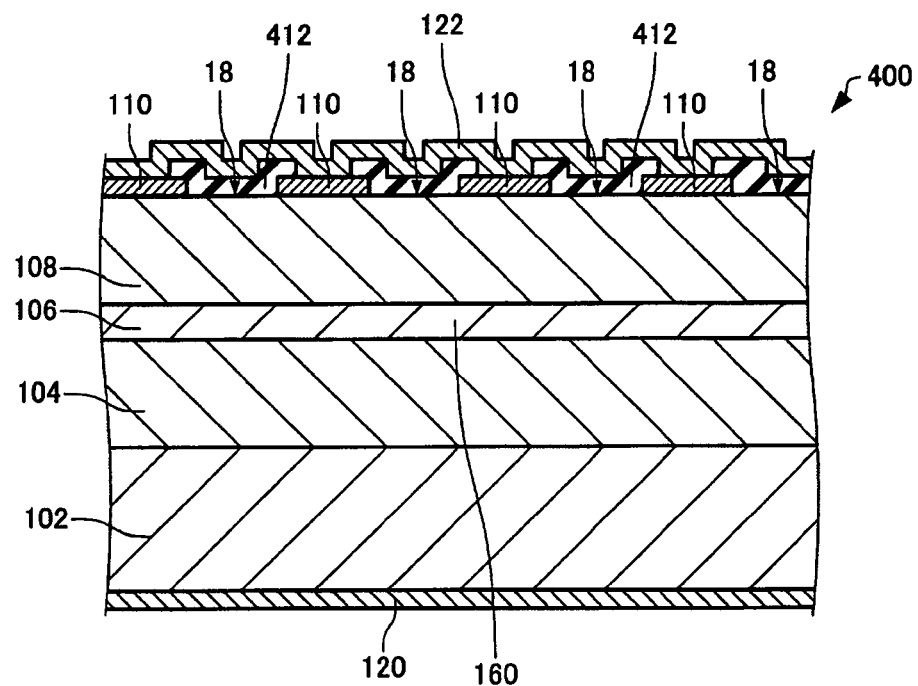
FIG. 13 is a sectional view schematically illustrating a light emitting device according to Modification Example 3 of the first embodiment.

Next, a description will be made of a light emitting device according to Modification Example 3 of the first embodiment with reference to the drawings. FIG. 13 is a sectional view schematically illustrating a light emitting device 400 according to Modification Example 3 of the first embodiment, and corresponds to FIG. 4.

In the above-described light emitting device 100, as illustrated in FIG. 4, the noncontact regions 18 of the second cladding layer 108 are in physical contact with the second electrode 122. In contrast, in the light emitting device 400, as illustrated in FIG. 13, an insulating layer 412 is provided between the noncontact regions 18 and the second electrode 122. In the illustrated example, the insulating layer 412 is also provided on a part of the top of the contact layer 110. A material of the insulating layer 412 is the same as that of the insulating layer 112 (refer to FIGS. 2 and 3), for example. The insulating layer 412 may be formed in the same step as that of the insulating layer 112.

In the light emitting device 400, the insulating layer 412 is provided between the noncontact regions 18 and the second electrode 122, and thus the noncontact regions 18 and the second electrode 122 can be more reliably electrically insulated from each other than in the light emitting device 100.

1.3.4. Modification Example 4

Figure 14:
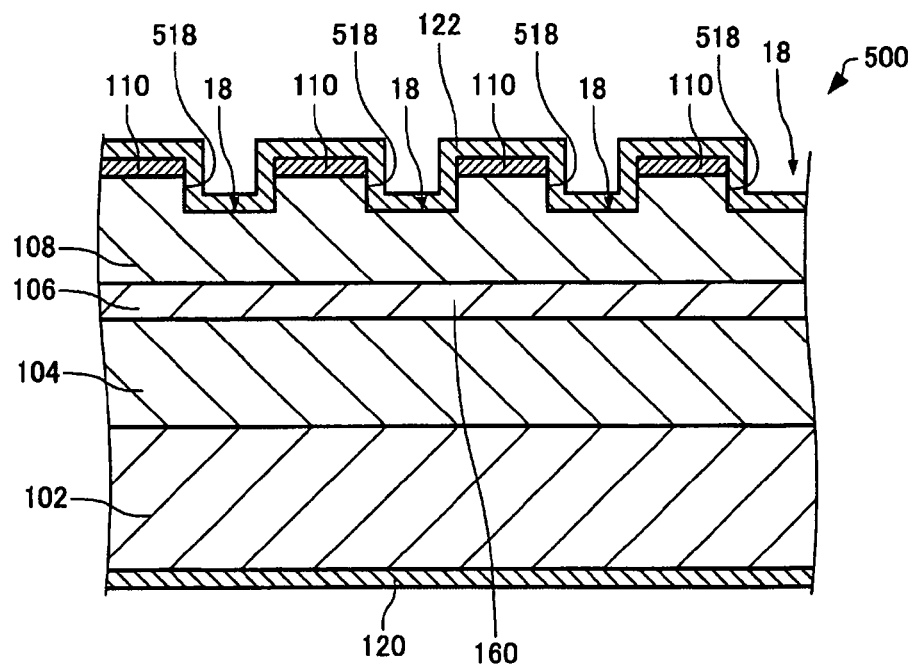
FIG. 14 is a sectional view schematically illustrating a light emitting device according to Modification Example 4 of the first embodiment.

Next, a description will be made of a light emitting device according to Modification Example 4 of the first embodiment with reference to the drawings. FIG. 14 is a sectional view schematically illustrating a light emitting device 500 according to Modification Example 4 of the first embodiment, and corresponds to FIG. 4.

In the above-described light emitting device 100, as illustrated in FIG. 4, the upper surface of the pillar shape portion 111 is a flat surface. In contrast, in the light emitting device 500, as illustrated in FIG. 14, the upper surface of the pillar shape portion 111 is provided with depressions 518. The noncontact regions 18 constitute, for example, bottoms of the depressions 518. A depth of each of the depressions 518 is smaller than the thickness (height) of the pillar shape portion 111. Specifically, the depth of the depression 518 does not influence propagation of light in the light waveguide 160.

In the light emitting device 500, the depressions 518 are provided, and thus a distance between the light waveguide 160 and the second electrode 122 can be reduced. For this reason, in the light emitting device 500, heat dissipation of the light waveguide 160 can be improved compared with the light emitting device 100.

1.3.5. Modification Example 5

Figure 15:
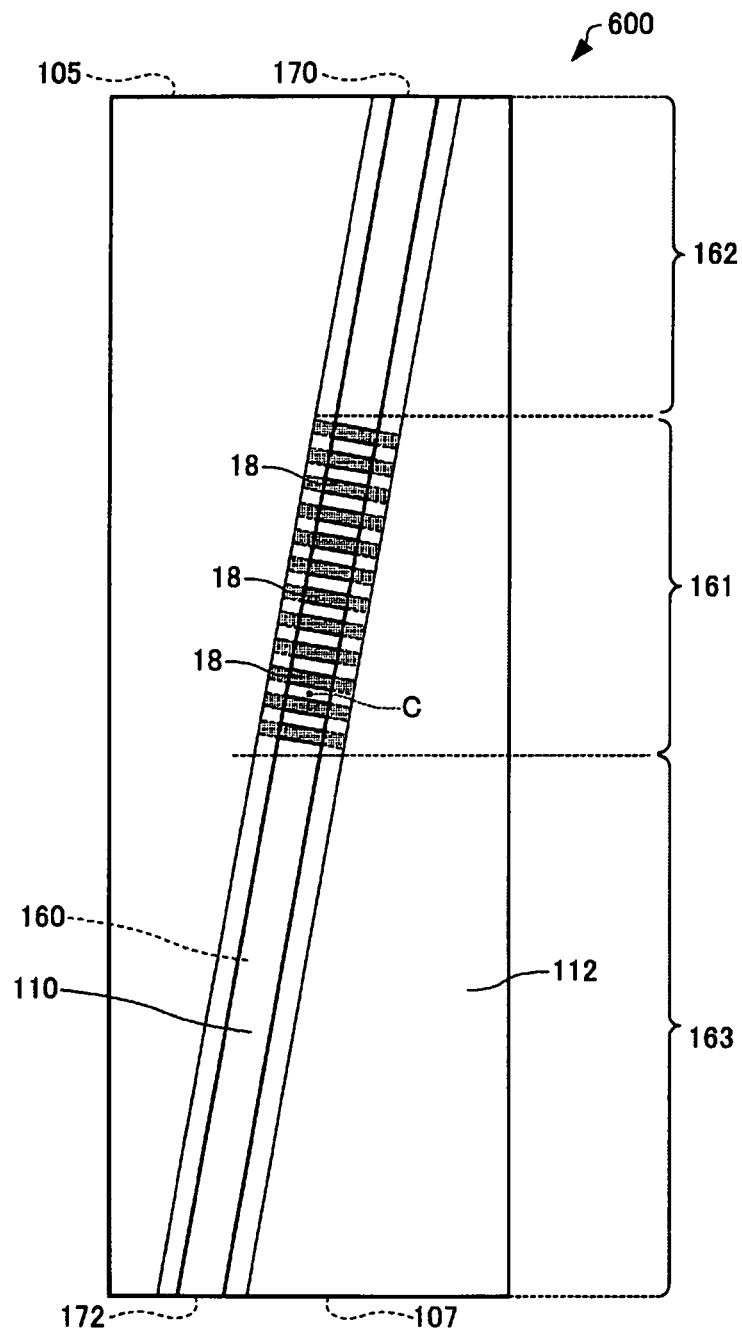
FIG. 15 is a plan view schematically illustrating a light emitting device according to Modification Example 5 of the first embodiment.

Next, a description will be made of a light emitting device according to Modification Example 5 of the first embodiment with reference to the drawings. FIG. 15 is a plan view schematically illustrating a light emitting device 600 according to Modification Example 5 of the first embodiment. For convenience, FIG. 15 does not illustrate the second electrode 122.

In the light emitting device 100, as illustrated in FIG. 1, the noncontact regions 18 are disposed so as to be symmetric to each other with respect to the central position C. In contrast, in the light emitting device 600, the noncontact regions 18 are not disposed so as to be symmetric to each other with respect to the central position C.

In the light emitting device 600, a length of the second region 162 in the extending direction of the light waveguide 160 is different from a length of the third region 163 in the extending direction of the light waveguide 160. In the illustrated example, the length of the second region 162 in the extending direction of the light waveguide 160 is smaller than the length of the third region 163 in the extending direction of the light waveguide 160. Although not illustrated, the length of the second region 162 in the extending direction of the light waveguide 160 may be larger than the length of the third region 163 in the extending direction of the light waveguide 160.

In the light emitting device 600, since the length of the second region 162 in the extending direction of the light waveguide 160 is different from the length of the third region 163 in the extending direction of the light waveguide 160, intensity of light emitted from the first light emission surface 170 can be made different from intensity of light emitted from the second light emission surface 172. As mentioned above, in the light emitting device 600, intensity of light emitted from the light emission surfaces 170 and 172 can be adjusted depending on positions where the noncontact regions 18 are formed.

1.3.6. Modification Example 6

Figure 16:
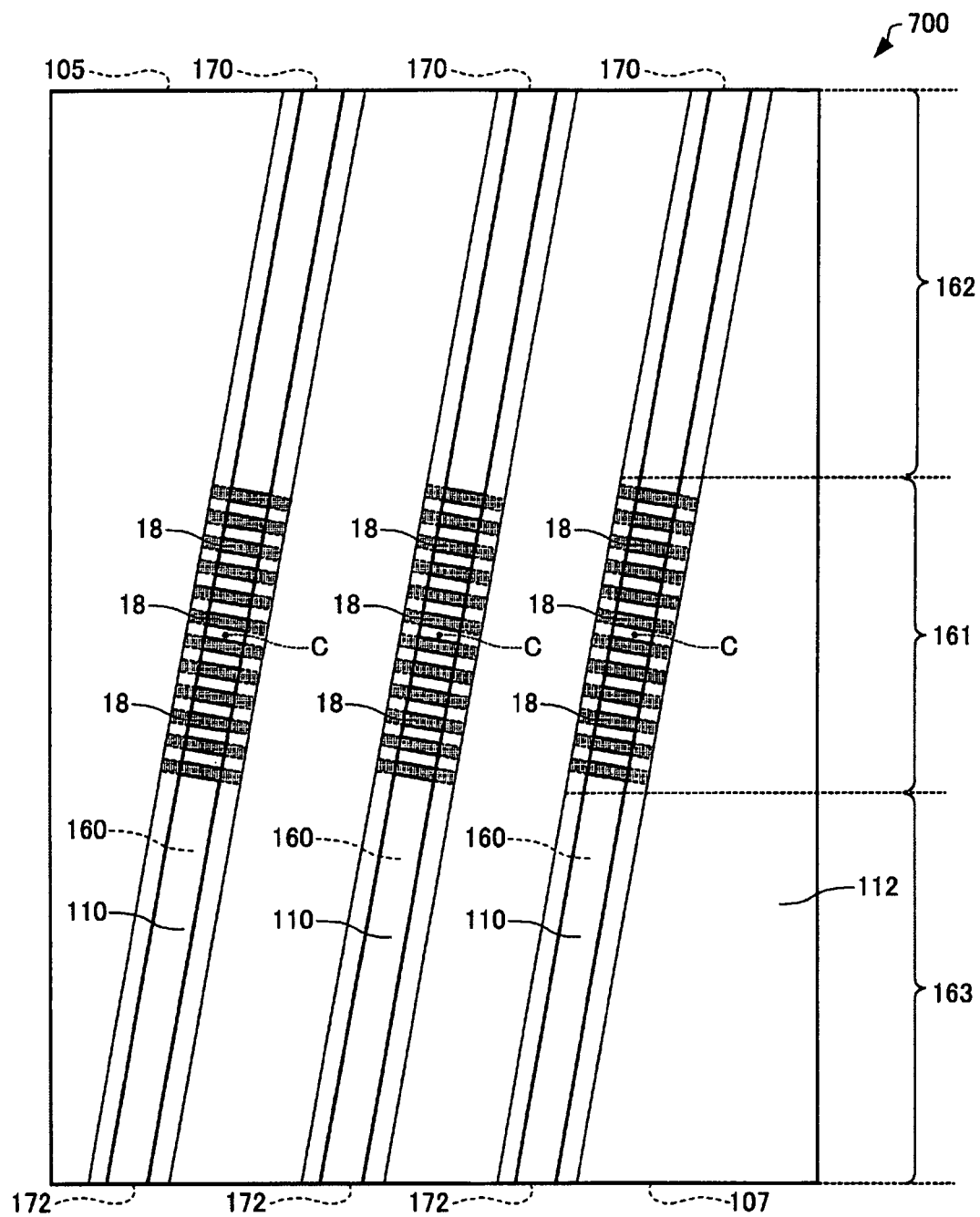
FIG. 16 is a plan view schematically illustrating a light emitting device according to Modification Example 6 of the first embodiment.

Next, a description will be made of a light emitting device according to Modification Example 6 of the first embodiment with reference to the drawings. FIG. 16 is a plan view schematically illustrating a light emitting device 700 according to Modification Example 6 of the first embodiment. For convenience, FIG. 16 does not illustrate the second electrode 122.

In the above-described light emitting device 100, as illustrated in FIG. 1, the light waveguide 160 is provided alone. In contrast, in the light emitting device 700, as illustrated in FIG. 16, a plurality of light waveguides 160 are provided. In the illustrated example, three light waveguides 160 are provided, but the number thereof is not particularly limited as long as a plurality of light waveguides are provided. The plurality of light waveguides 160 are provided at the same intervals in a direction parallel to the first side surface 105, for example, in a plan view.

The light emitting device 700 can achieve higher output than the light emitting device 100.

1.3.7. Modification Example 7

Figure 17:
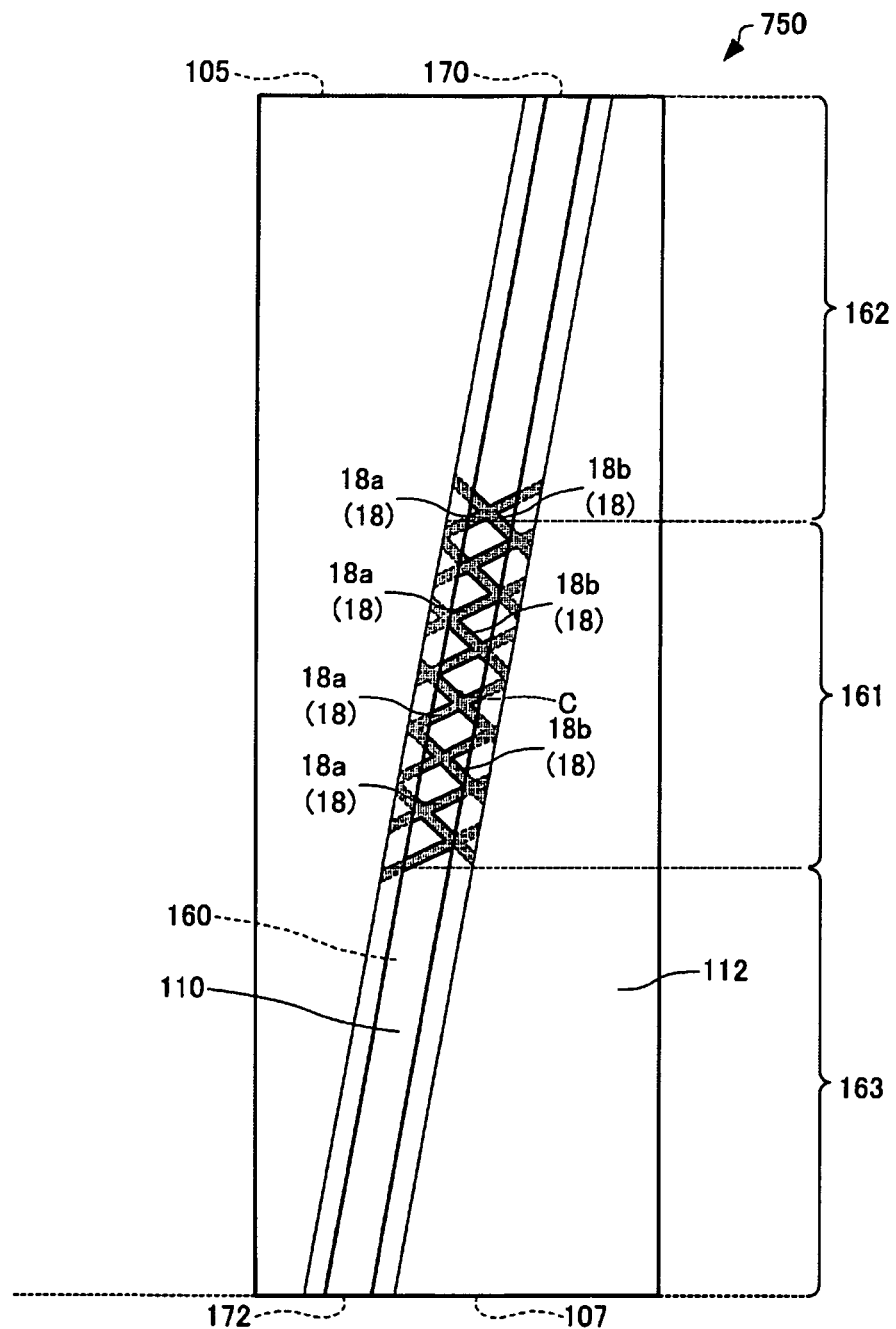
FIG. 17 is a plan view schematically illustrating a light emitting device according to Modification Example 7 of the first embodiment.

Next, a description will be made of a light emitting device according to Modification Example 7 of the first embodiment with reference to the drawings. FIG. 17 is a plan view schematically illustrating a light emitting device 750 according to Modification Example 7 of the first embodiment. For convenience, FIG. 17 does not illustrate the second electrode 122.

In the above-described light emitting device 100, as illustrated in FIG. 1, the slopes of the long sides of the plurality of noncontact regions 18 are the same as each other in a plan view. In contrast, the light emitting device 750 is provided with, as illustrated in FIG. 17, first noncontact regions 18a having long sides which are tilted with a first angle with respect to the extending direction of the light waveguide 160 and second noncontact regions 18b having long sides which are tilted with a second angle with respect to the extending direction of the light waveguide 160 in a plan view. The first noncontact regions 18a and the second noncontact regions 18b intersect each other in a plan view. The noncontact regions 18a and 18b are respectively provided in a plurality. Pitches of the first noncontact regions 18a and pitches of the second noncontact regions 18b may be the same as or different from each other.

As described above, the light emitting device 750 is provided with the first noncontact regions 18a and the second noncontact regions 18b. For this reason, in the light emitting device 750, the ratio (B1/A1) can be easily increased, and thus it becomes easier to control an averaged current amount. For example, in a case where only the noncontact regions 18 having the long sides which are tilted with a predetermined angle with respect to the extending direction of the light waveguide 160 are provided as in the light emitting device 100, there is a case where it may be hard to densely form the noncontact regions 18 in terms of manufacturing steps.

2. Second Embodiment

2.1. Light Emitting Device

Figure 18:
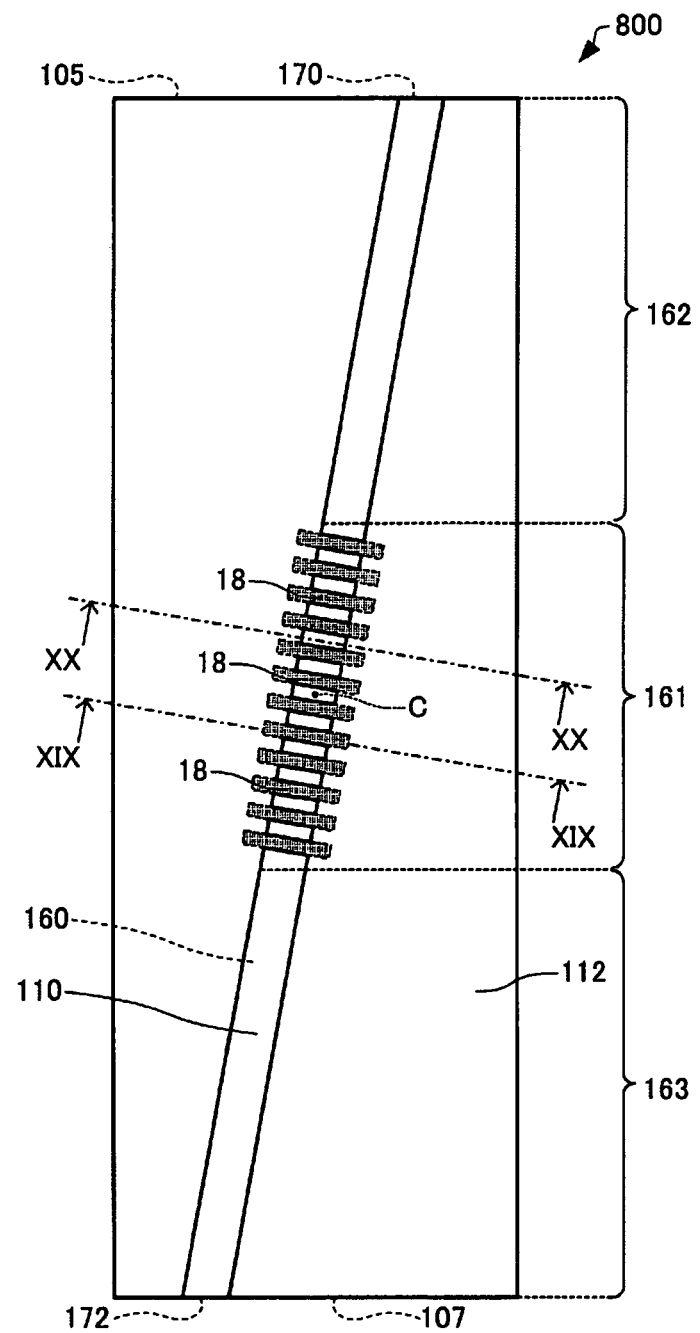
FIG. 18 is a plan view schematically illustrating a light emitting device according to a second embodiment.
Figure 19:
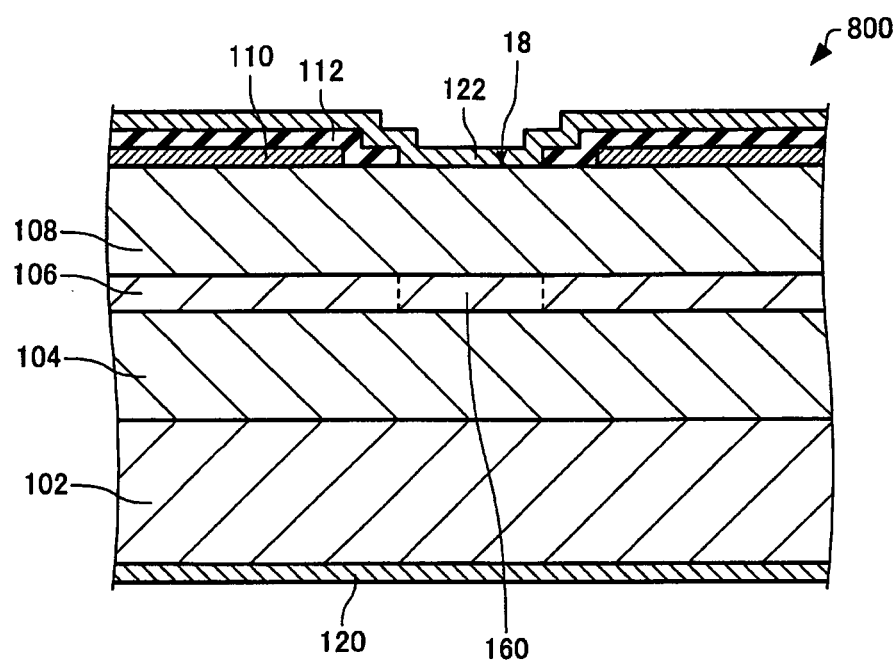
FIG. 19 is a sectional view schematically illustrating the light emitting device according to the second embodiment.
Figure 20:
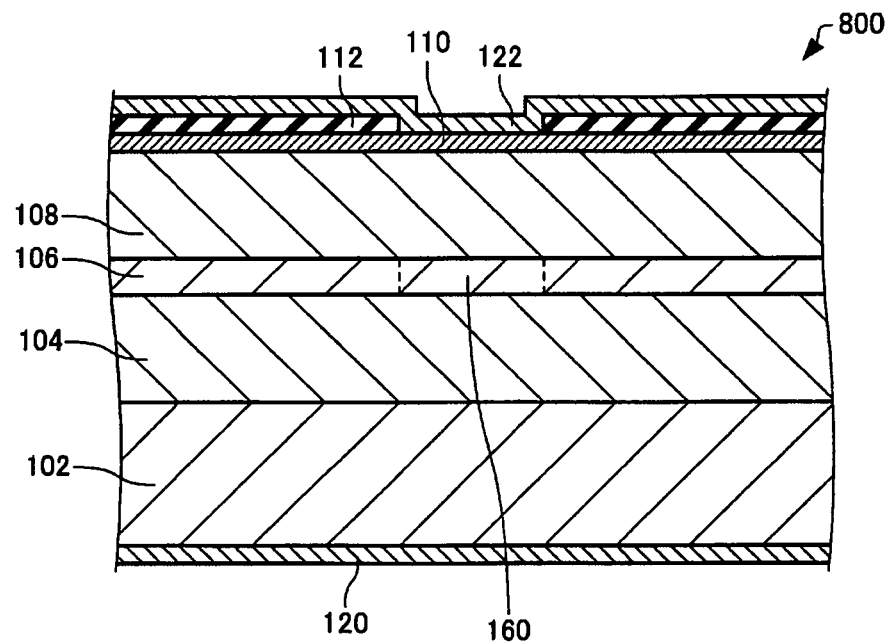
FIG. 20 is a sectional view schematically illustrating the light emitting device according to the second embodiment.

Next, a light emitting device according to a second embodiment will be described with reference to the drawings. FIG. 18 is a plan view schematically illustrating a light emitting device 800 according to the second embodiment. FIG. 19 is a sectional view taken along the line XIX-XIX of FIG. 18 and schematically illustrates the light emitting device 800 according to the second embodiment. FIG. 20 is a sectional view taken along the line XX-XX of FIG. 18 and schematically illustrates the light emitting device 800 according to the second embodiment. For convenience, FIG. 18 does not illustrate the second electrode 122.

Hereinafter, in the light emitting device 800 according to the second embodiment, differences from the example of the light emitting device 100 according to the first embodiment will be described, and similarities thereto will not be described.

As illustrated in FIGS. 1 to 3, the above-described light emitting device 100 is a refractive index waveguide in which light is confined by providing a refractive index difference between the region in which the insulating layer 112 is formed and the region in which the insulating layer 112 is not formed, that is, the region in which the pillar shape portion 111 is formed, as illustrated in FIGS. 1 to 3. In contrast, as illustrated in FIGS. 18 to 20, the light emitting device 800 is a gain waveguide in which a region of the active layer 106 into which a current is injected is used as the light waveguide 160 as it is instead of a refractive index difference being provided through the formation of the pillar shape portion 111.

The light emitting device 800 can reduce the gain saturation and can achieve high output in the same manner as the light emitting device 100.

2.2. Manufacturing Method of Light Emitting Device

Next, a description will be made of a manufacturing method of the light emitting device 800 according to the second embodiment. The manufacturing method of the light emitting device 800 according to the second embodiment is fundamentally the same as the manufacturing method of the light emitting device 100 according to the first embodiment except that the pillar shape portion 111 is not formed. Therefore, detailed description thereof will be omitted.

3. Third Embodiment

Figure 21:
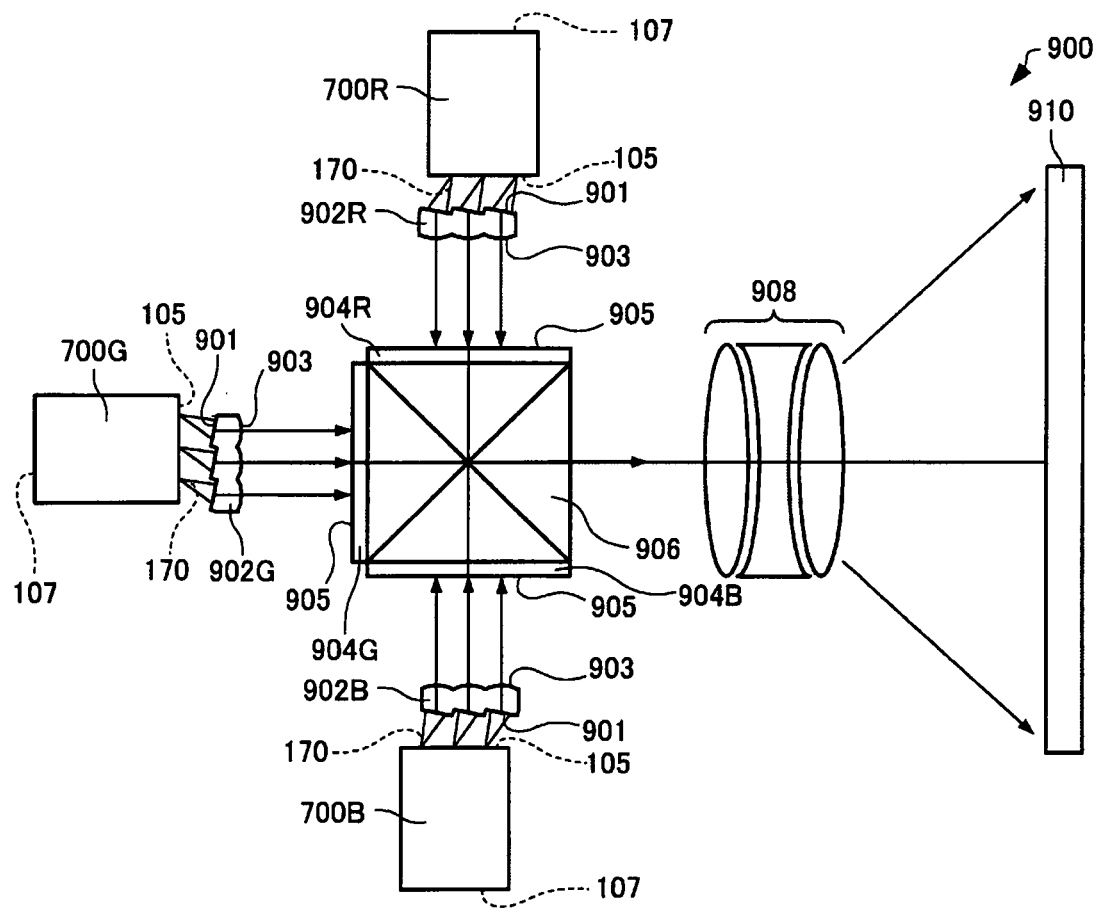
FIG. 21 is a diagram schematically illustrating a projector according to a third embodiment.

Next, a description will be made of a projector according to a third embodiment with reference to the drawing. FIG. 21 is a diagram schematically illustrating a projector 900 according to the third embodiment. For convenience, in FIG. 21, a casing constituting the projector 900 is not illustrated, and light sources 700R, 700G and 700B are illustrated for simplification.

As illustrated in FIG. 21, the projector 900 includes the red light source 700R, the green light source 700G, and the blue light source 700B which respectively emit red light, green light, and blue light. The red light source 700R, the green light source 700G, and the blue light source 700B are light emitting devices according to the embodiment of the invention. Hereinafter, a description will be made of an example in which the light emitting device 700 is used as a light emitting device according to the embodiment of the invention.

The projector 900 further includes lens arrays 902R, 902G and 902B, transmissive type liquid crystal light valves (light modulation devices) 904R, 904G and 904B, and a projection lens (projection device) 908.

Light beams emitted from the light sources 700R, 700G and 700B are respectively incident to the lens arrays 902R, 902G and 902B. Each of the lens arrays 902R, 902G and 902B includes an incidence surface 901 to which light emitted from the first light emission surface 170 is incident, on each side of the light sources 700R, 700G and 700B. The incidence surface 901 is, for example, a flat surface. A plurality of incidence surfaces 901 are provided so as to correspond to a plurality of first light emission surfaces 170 and are disposed at the same intervals. A normal line (not illustrated) of the incidence surface 901 is tilted with respect to the first side surface 105. The incidence surfaces 901 can cause optical axes of the light beams emitted from the first light emission surfaces 170 to be perpendicular to irradiation surfaces 905 of the liquid crystal light valves 904R, 904G and 904B.

Each of the lens arrays 902R, 902G and 902B includes an emission surface 903 on each side of the liquid crystal light valves 904R, 904G and 904B. The emission surface 903 is, for example, a convex surface. A plurality of emission surfaces 903 are provided so as to correspond to the plurality of incidence surfaces 901 and are disposed at the same intervals. The light beams whose optical axes are converted in the incidence surfaces 901 may be collected via the emission surfaces 903 or may be superimposed (partially superimposed) by reducing diffusion angles thereof. Consequently, the liquid crystal light valves 904R, 904G and 904B can be uniformly irradiated.

As mentioned above, the lens arrays 902R, 902G and 902B can control the optical axes of the light beams emitted from the first light emission surfaces 170 and can collect the light beams.

The light beams collected by the lens arrays 902R, 902G and 902B are respectively incident to the liquid crystal light valves 904R, 904G and 904B. The respective liquid crystal light valves 904R, 904G and 904B modulate the incident light beams according to image information. The projection lens 908 enlarges images formed by the liquid crystal light valves 904R, 904G and 904B and projects the enlarged images onto a screen (display surface) 910.

The projector 900 may include a cross dichroic prism (color light combining device) 906 which combines light beams emitted from the liquid crystal light valves 904R, 904G and 904B and guides combined light to the projection lens 908.

Three color light beams modulated by the liquid crystal light valves 904R, 904G and 904B are incident to the cross dichroic prism 906. The prism is formed by joining four right-angle prisms to each other, and a dielectric multilayer film reflecting red light and a dielectric multilayer film reflecting blue light are disposed in a cross shape. The three color light beams are combined with each other by the dielectric multilayer films, and thus light exhibiting a color image is formed. The combined light is projected onto the screen 910 by the projection lens 908 which is a projection optical system, and thus an enlarged image is displayed.

In the example illustrated in FIG. 21, light emitted from the second light emission surface 172 provided on the second side surface 107 is not illustrated, but the light may be incident to a reflection portion and a lens array (not illustrated) and may then be incident to the liquid crystal light valves 904R, 904G and 904B.

The projector 900 includes the light emitting device 700 which can reduce the gain saturation and can achieve high output. For this reason, the projector 900 can achieve high luminance.

In the above-described example, the transmissive type liquid crystal light valves are used as light modulation devices, but light valves other than the liquid crystal light valves may be used, and reflective type light valves may be used. Such light valves may include, for example, reflective type liquid crystal light valves or digital micromirror devices. A configuration of the projection optical system is changed as appropriate depending on the type of light valve which is used.

The light sources 700R, 700G and 700B are applicable to light emitting devices of a scanning type image display apparatus (projector) including a scanning device as an image forming device which displays an image with a desired size on a display surface by scanning the screen with light from the light sources 700R, 700G and 700B.

The above-described embodiments and modification examples are only examples, and the invention is not limited thereto. For example, the respective embodiments and the respective modification examples may be combined with each other as appropriate.

For example, the invention includes substantially the same configuration (for example, a configuration in which functions, methods, and results are the same, or a configuration in which objects and effects are the same) as the configuration described in the embodiment. The invention includes a configuration in which an inessential part of the configuration described in the embodiment is replaced with another part. The invention includes a configuration which achieves the same operation and effect or a configuration capable of achieving the same object as in the configuration described in the embodiment. The invention includes a configuration in which a well-known technique is added to the configuration described in the embodiment.

The entire disclosure of Japanese Patent Application No. 2014-260943 filed Dec. 24, 2014 is expressly incorporated by reference herein.

What is claimed is:

1. A light emitting device comprising:
   an active layer configured to generate light in correspondence with a current injected thereinto;
   a first cladding layer and a second cladding layer sandwiching the active layer therebetween; and
   a first electrode and a second electrode configured to inject the current into the active layer,
   wherein the active layer constitutes a light waveguide through which the light is guided,
   wherein the light waveguide is provided with:
      a first light emission surface and a second light emission surface from which the light is emitted;
      a first region including a midpoint that is equidistant from the first light emission surface and the second light emission surface;
      a second region including the first light emission surface; and
      a third region including the second light emission surface,
   wherein the second cladding layer includes a plurality of noncontact regions that are not electrically connected to the second electrode,
   wherein the plurality of noncontact regions intersect the light waveguide in a plan view, and
   wherein, in the plan view, a ratio of an area in which the plurality of noncontact regions overlap the first region to an area of the first region is greater than a ratio of an area in which the plurality of noncontact regions overlap the second region to an area of the second region, and is greater than a ratio of an area in which the plurality of noncontact regions overlap the third region to an area of the third region.

2. The light emitting device according to claim 1, further comprising:
   a contact layer that is provided between the second cladding layer and the second electrode,
   wherein the contact layer is not provided in the plurality of noncontact regions.

3. The light emitting device according to claim 1,
   wherein the plurality of noncontact regions only intersect the first region in the plan view.

4. The light emitting device according to claim 1,
   wherein pitches of the plurality of noncontact regions gradually increase toward the first light emission surface and the second light emission surface from the midpoint.

5. The light emitting device according to claim 1,
   wherein, in the plan view, pitches of the plurality of noncontact regions overlapping the first region are equal to each other, pitches of the plurality of noncontact regions overlapping the second region gradually increase toward the first light emission surface from the midpoint, and pitches of the plurality of noncontact regions overlapping the third region gradually increase toward the second light emission surface from the midpoint.

6. The light emitting device according to claim 1,
   wherein a length of the first region in an extending direction of the light waveguide is L/4 or more and 3L/4 or less, wherein L is a length of the light waveguide in the extending direction between the first light emission surface and the second light emission surface.

7. The light emitting device according to claim 1,
   wherein the light waveguide extends in a tilted direction with respect to a normal line of the first light emission surface and a normal line of the second light emission surface.

8. A projector comprising:
   the light emitting device according to claim 1;
   a light modulation device configured to modulate the light emitted from the light emitting device according to image information; and
   a projection device configured to project an image formed by the light modulation device.

9. A projector comprising:
   the light emitting device according to claim 2;
   a light modulation device configured to modulate the light emitted from the light emitting device according to image information; and
   a projection device configured to project an image formed by the light modulation device.

10. A projector comprising:
    the light emitting device according to claim 3;
    a light modulation device configured to modulate the light emitted from the light emitting device according to image information; and
    a projection device configured to project an image formed by the light modulation device.

11. A projector comprising:
    the light emitting device according to claim 4;

a light modulation device configured to modulate the light emitted from the light emitting device according to image information; and a projection device configured to project an image formed by the light modulation device.

12. A projector comprising:

the light emitting device according to claim 5;

a light modulation device configured to modulate the light emitted from the light emitting device according to image information; and a projection device configured to project an image formed by the light modulation device.

13. A projector comprising:

the light emitting device according to claim 6;

a light modulation device configured to modulate the light emitted from the light emitting device according to image information; and a projection device configured to project an image formed by the light modulation device.

14. A projector comprising:

the light emitting device according to claim 7;

a light modulation device configured to modulate the light emitted from the light emitting device according to image information; and a projection device configured to project an image formed by the light modulation device.

* * * * *